(12) United States Patent
Nakano

(10) Patent No.: US 11,602,928 B2
(45) Date of Patent: Mar. 14, 2023

(54) METHOD OF MANUFACTURING DISK DRIVE SUSPENSION AND MANUFACTURING APPARATUS OF THE SAME

(71) Applicant: NHK SPRING CO., LTD., Yokohama (JP)

(72) Inventor: Kenichiro Nakano, Yokohama (JP)

(73) Assignee: NHK SPRING CO., LTD., Kanagawa (JP)

( * ) Notice: Subject to any disclaimer, the term of this patent is extended or adjusted under 35 U.S.C. 154(b) by 0 days.

(21) Appl. No.: 17/486,824

(22) Filed: Sep. 27, 2021

(65) Prior Publication Data

US 2022/0097357 A1    Mar. 31, 2022

(30) Foreign Application Priority Data

Sep. 29, 2020   (JP) .............................. JP2020-162865

(51) Int. Cl.
| | | |
|---|---|---|
| B32B 41/00 | (2006.01) | |
| G11B 5/48 | (2006.01) | |
| B32B 37/12 | (2006.01) | |
| H01L 41/313 | (2013.01) | |

(52) U.S. Cl.
CPC .............. B32B 41/00 (2013.01); B32B 37/12 (2013.01); G11B 5/484 (2013.01); H01L 41/313 (2013.01)

(58) Field of Classification Search
CPC ......... B32B 41/00; B32B 37/12; G11B 5/484; H01L 41/313

USPC ................... 156/60, 64, 350, 351, 378, 379
See application file for complete search history.

(56) References Cited

U.S. PATENT DOCUMENTS

| | | | | |
|---|---|---|---|---|
| 8,630,067 | B2 * | 1/2014 | Ando | ................... G11B 5/5552 360/294.4 |
| 2001/0043443 | A1 | 11/2001 | Okamoto et al. | |
| 2011/0242708 | A1 | 10/2011 | Fuchino | |
| 2018/0275441 | A1 * | 9/2018 | Tashima | ............ G02F 1/133788 |

FOREIGN PATENT DOCUMENTS

| | | |
|---|---|---|
| JP | 2002050140 A | 2/2002 |
| JP | 2011216160 A | 10/2011 |
| JP | 2017191914 A | 10/2017 |

OTHER PUBLICATIONS

Kay, Mike, "Select the most effective wavelength for an LED system", https://www.mddionline.com/print/6133, 3 of 4, (Year: 2010).*

* cited by examiner

Primary Examiner — Michael N Orlando
Assistant Examiner — Joshel Rivera
(74) Attorney, Agent, or Firm — Holtz, Holtz & Volek PC

(57) ABSTRACT

A method of manufacturing a disk drive suspension includes applying an adhesive to an actuator mounting portion, increasing viscosity of the adhesive by emitting light to the adhesive applied to the actuator mounting portion, arranging the piezoelectric element on the adhesive having the increased viscosity, detecting a height of the piezoelectric element arranged on the actuator mounting portion, and correcting an irradiation condition of the light in accordance with the detected height of the piezoelectric element.

7 Claims, 17 Drawing Sheets

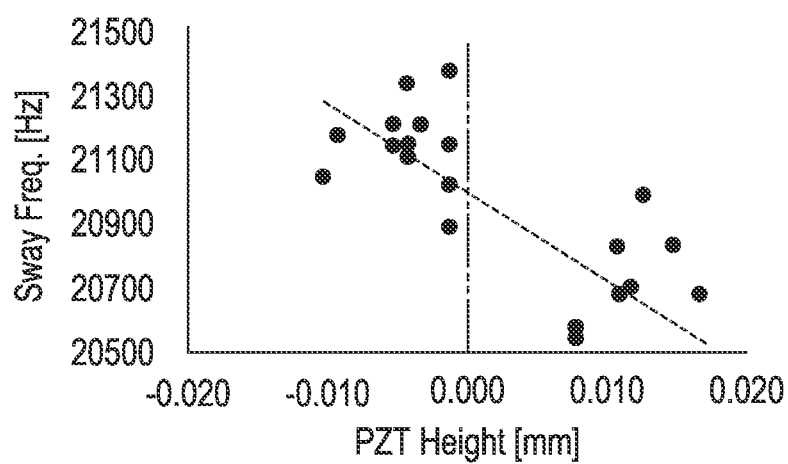
F I G. 12

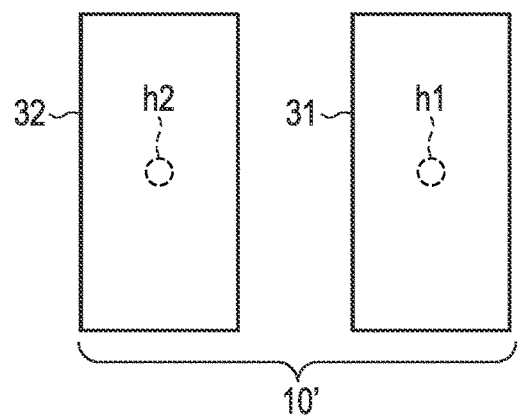 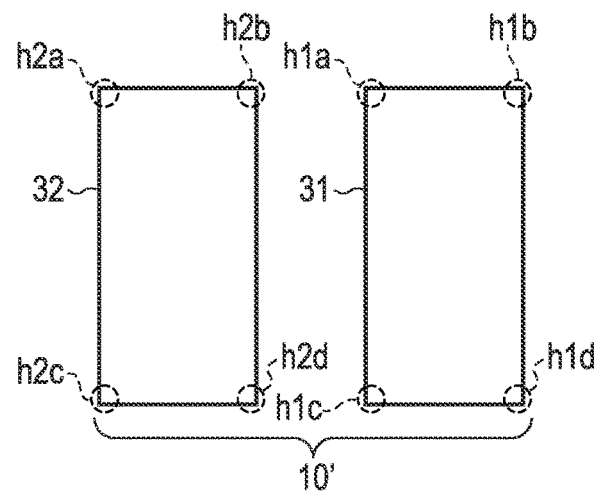
FIG. 16A   FIG. 16B
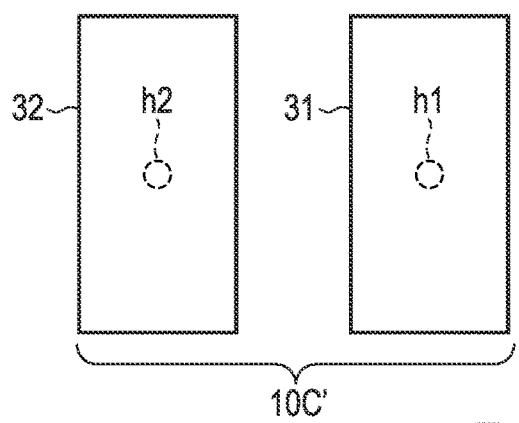 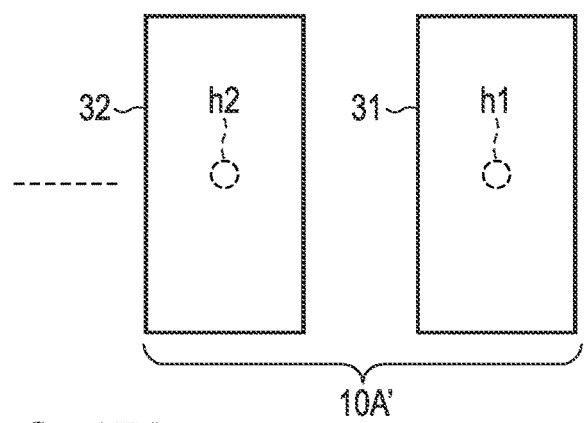
FIG. 17A
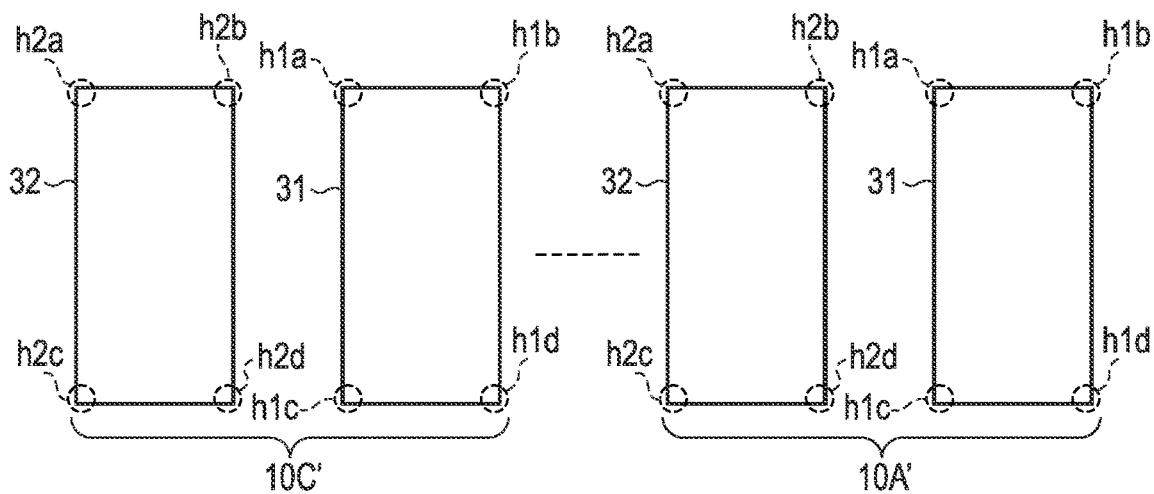
FIG. 17B

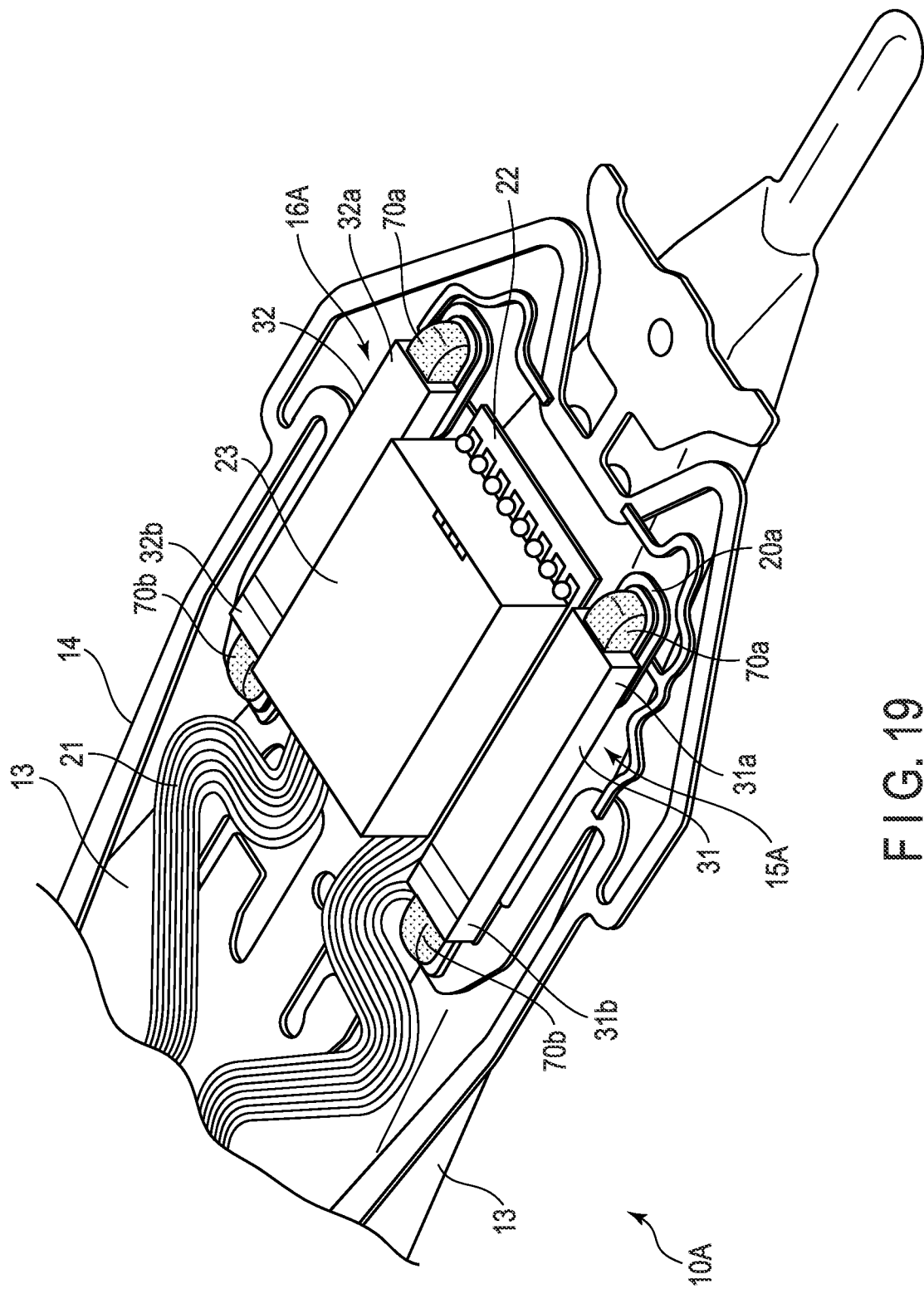
F I G. 19

METHOD OF MANUFACTURING DISK DRIVE SUSPENSION AND MANUFACTURING APPARATUS OF THE SAME

CROSS-REFERENCE TO RELATED APPLICATIONS

This application is based upon and claims the benefit of priority from prior Japanese Patent Application No. 2020-162865, filed Sep. 29, 2020, the entire contents of which are incorporated herein by reference.

BACKGROUND OF THE INVENTION

1. Field of the Invention

The present invention relates to a method of manufacturing a disk drive suspension comprising a piezoelectric element, and a manufacturing apparatus thereof.

2. Description of the Related Art

Disk drives have been used in information processing devices such as personal computers. The disk drive includes a magnetic disk rotating about a spindle, a carriage pivoting about a pivot, and the like. A disk drive suspension is provided on an arm of the carriage.

The disk drive suspension comprises a base plate, a load beam, a flexure arranged along the load beam, and the like. A slider is provided on a gimbal portion formed near the distal end of the flexure. Elements for making access such as read and write of data recorded on a disk is provided on the slider.

To respond to high-density recording on the disk, the magnetic head needs to be positioned on the record surface of the disk with a higher accuracy. For this reason, a suspension comprising a piezoelectric element which functions as an actuator has been developed as disclosed in JP 2002-50140 A and JP 2011-216160 A.

The piezoelectric element is arranged on an actuator mounting portion of the suspension. When the piezoelectric element is fixed to the actuator mounting portion by an adhesive, the adhesive is applied to the actuator mounting portion. Then, the piezoelectric element is placed on the uncured adhesive. After that, the adhesive is heated by supplying the suspension to the heating device. The heated adhesive is cured and the piezoelectric device is thereby fixed to the actuator mounting portion.

In the production line of the suspension, the piezoelectric element placed on the uncured adhesive may be unintentionally moved. When the piezoelectric element is displaced from a predetermined position, the piezoelectric element serving as the actuator cannot exert a predetermined performance. In addition, knowledge has been obtained that if the height of the piezoelectric element is varied, the resonance characteristic of a sway mode and a yaw mode is affected depending on the type of the suspension.

Arranging a piezoelectric element on an adhesive applied to an actuator mounting portion and then spraying high temperature gas by a heater to temporarily cure the adhesive, similarly to an electronic device manufacturing apparatus disclosed in JP 2017-191914 A, has also been proposed. However, a problem arises that a piezoelectric element is moved due to surface tension of the adhesive, vibration, or the like before the adhesive is cured temporarily. In addition, when the viscosity of the adhesive is unstable at the time of arranging the piezoelectric element, the height of the piezoelectric element may also be varied after curing the adhesive.

BRIEF SUMMARY OF THE INVENTION

The present invention aims to provide a method of manufacturing a disk drive suspension capable of stabilizing a position and a height of the piezoelectric element arranged at the actuator mounting portion, and a manufacturing apparatus thereof.

According to one embodiment, a method of manufacturing a disk drive suspension includes applying an adhesive to an actuator mounting portion; increasing viscosity of the adhesive by emitting light to the adhesive applied to the actuator mounting portion; arranging the piezoelectric element on the adhesive having the increased viscosity; detecting a height of the piezoelectric element arranged on the actuator mounting portion; and correcting an irradiation condition of the light in accordance with the detected height of the piezoelectric element.

The method may further include fixing the piezoelectric element to the actuator mounting portion by heating the actuator mounting portion on which the piezoelectric element is arranged and curing the adhesive.

In the above method, the correcting the irradiation condition may include raising at least one of an irradiation time, an illuminance, and a quantity of the light when the height of the piezoelectric element is smaller than a first threshold value, and lowering at least one of the irradiation time, the illuminance, and the quantity of the light when the height of the piezoelectric element is larger than a second threshold value.

In the above method, the height used to correct the irradiation condition may be a height of a central part of the piezoelectric element or an average value of heights of a plurality of parts in the piezoelectric element. Alternatively, the height may be an average value of heights of the piezoelectric elements arranged on actuator mounting portions of a plurality of disk drive suspensions.

According to one embodiment, a manufacturing apparatus of a disk drive suspension comprises an adhesive supply device applying an adhesive to an actuator mounting portion; a light irradiation device increasing viscosity of the adhesive by emitting light to the adhesive applied to the actuator mounting portion; an element supply device arranging the piezoelectric element on the adhesive having the increased viscosity; a height detector detecting a height of the piezoelectric element arranged on the actuator mounting portion; and a controller correcting an irradiation condition of the light of the light irradiation device in accordance with the height detected by the height detector.

In the above manufacturing apparatus, the controller may raise at least one of an irradiation time, an illuminance, and a quantity of the light from the light irradiation device when the height of the piezoelectric element is smaller than a first threshold value, and lower at least one of the irradiation time, the illuminance, and the quantity of the light from the light irradiation device when the height of the piezoelectric element is larger than a second threshold value.

In the above manufacturing apparatus, the controller may stop an operation of the manufacturing apparatus when the correction of lowering at least one of the irradiation time, the illuminance, and the quantity of the light from the light irradiation device is successively executed at a first determined number of times or when the correction of raising at least one of the irradiation time, the illuminance, and the quantity of the light from the light irradiation device is successively executed at a second determined number of times.

According to the present invention, the position and the height of the piezoelectric element arranged on the actuator mounting portion of the disk drive suspension can be stabilized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 12 is a graph showing a relationship between a height and a sway frequency of the piezoelectric element.

FIG. 16A and FIG. 16B are diagrams schematically showing the other examples of the detection position of the height of the piezoelectric device.

FIG. 17A and FIG. 17B are diagrams schematically showing the other examples of the detection position of the height of the piezoelectric device.

FIG. 19 is a perspective view showing parts of a disk drive suspension according to a second embodiment.

DETAILED DESCRIPTION OF THE INVENTION

A disk drive suspension, and a manufacturing method and a manufacturing apparatus thereof, according to a first embodiment will be described hereinafter with reference to FIG. 1 to FIG. 18.

Figure 1:
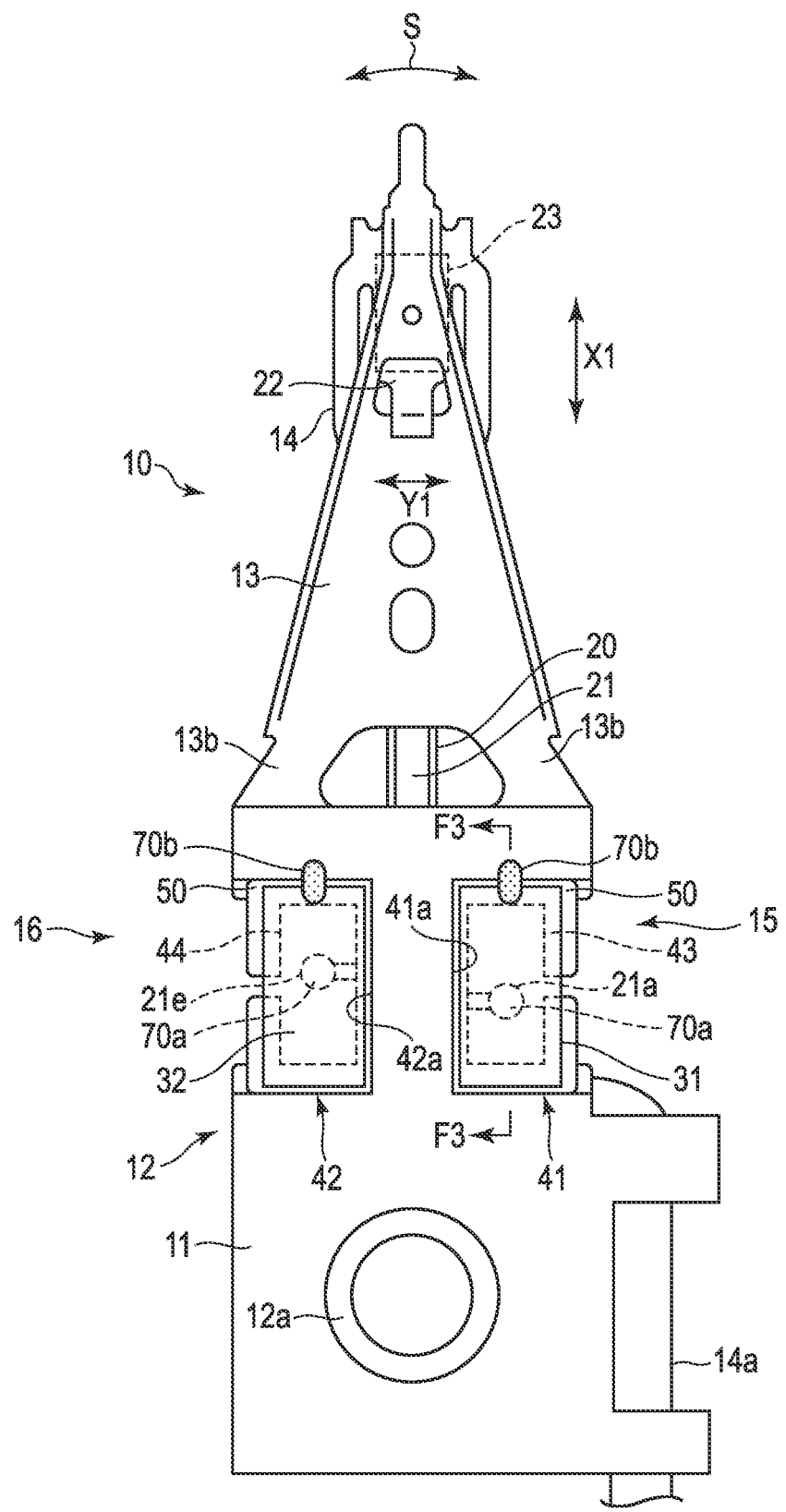
FIG. 1 is a plan view showing a disk drive suspension comprising an actuator mounting portion according to a first embodiment.

FIG. 1 is a plan view showing a disk drive suspension 10 (hereinafter simply referred to as a suspension 10) according to one embodiment.

Figure 2:
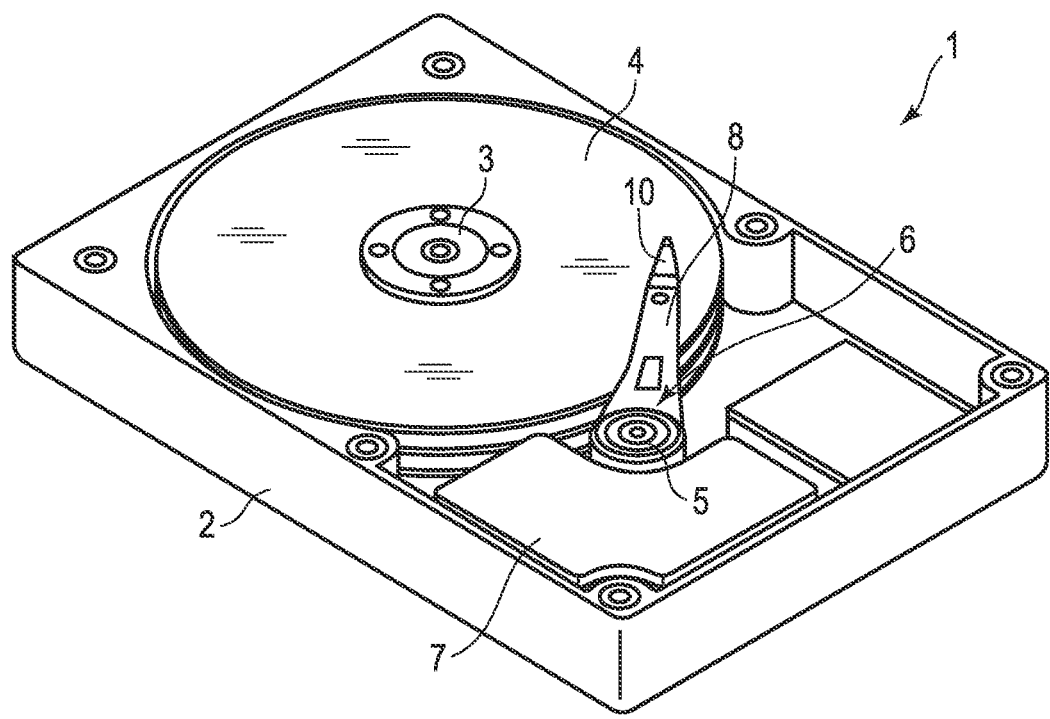
FIG. 2 is a perspective view showing an example of a disk drive.

FIG. 2 is a perspective view showing an example of a disk drive comprising the suspension 10. A disk drive 1 comprises a casing 2, a disk 4 rotating about a spindle 3, a carriage 6 pivoting about a pivot 5, a positioning motor 7 pivoting the carriage 6, and the like. The casing 2 is sealed by a lid (not shown). The suspension 10 is attached to an arm 8 of the carriage 6.

The suspension 10 shown in FIG. 1 comprises a base portion 12 including a base plate 11, a load beam 13 formed of a stainless steel plate, a flexure 14, and a pair of actuator mounting portions 15 and 16. A boss part 12a to be fixed to the arm 8 of the carriage 6 is formed on the base portion 12.

A proximal part 13a (partially shown in FIG. 3) of the load beam 13 is overlaid on the base plate 11. A hinge part 13b which can be flexed elastically in the thickness direction is formed near the proximal part 13a of the load beam 13. A direction represented by an arrow X1 in FIG. 1 is a length direction of the suspension 10. A direction represented by an arrow Y1 in FIG. 1 is a width direction of the suspension 10.

The flexure 14 extends in the length direction of the suspension 10 along the load beam 13. The flexure 14 includes a metal base 20 formed of a stainless steel plate thinner than the load beam 13, and a wiring portion 21 (partially shown in FIG. 1) formed along the metal base 20.

A tongue 22 which functions as a gimbal portion is formed near the distal end of the flexure 14. A slider 23 forming a magnetic head is arranged at the tongue 22. The slider 23 is provided with an element for magnetically recording data on the disk 4 (shown in FIG. 2), an element for reading the data recorded on the disk 4, and the like. A rear part (flexure tail 14a) of the flexure 14 extends to back side of the base portion 12.

The pair of actuator mounting portions 15 and 16 are provided on the base portion 12 of the suspension 10. In FIG. 1, the first actuator mounting portion 15 is arranged on the right side of the base portion 12. In FIG. 1, the second actuator mounting portion 16 is arranged on the left side of the base portion 12.

Piezoelectric elements 31 and 32 which function as actuators are arranged on the actuator mounting portions 15 and 16, respectively. The piezoelectric elements 31 and 32 are formed of a piezoelectric material such as lead zirconate titanate (PZT) and the like and comprise a function of slightly moving the distal part side of the suspension 10. The piezoelectric elements 31 and 32 extend and contrast according to a voltage applied to the piezoelectric elements 31 and 32. The distal end side of the suspension 10 can be thereby moved to the sway direction (represented by a double-headed arrow S in FIG. 1).

Figure 3:
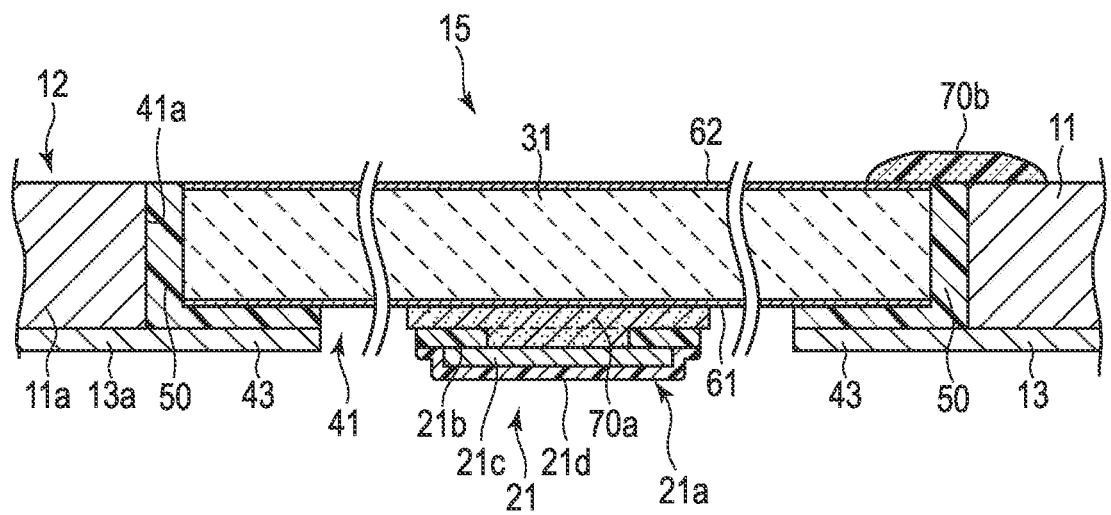
FIG. 3 is a cross-sectional view showing the actuator mounting portion taken along line F3-F3 of FIG. 1.
Figure 4:
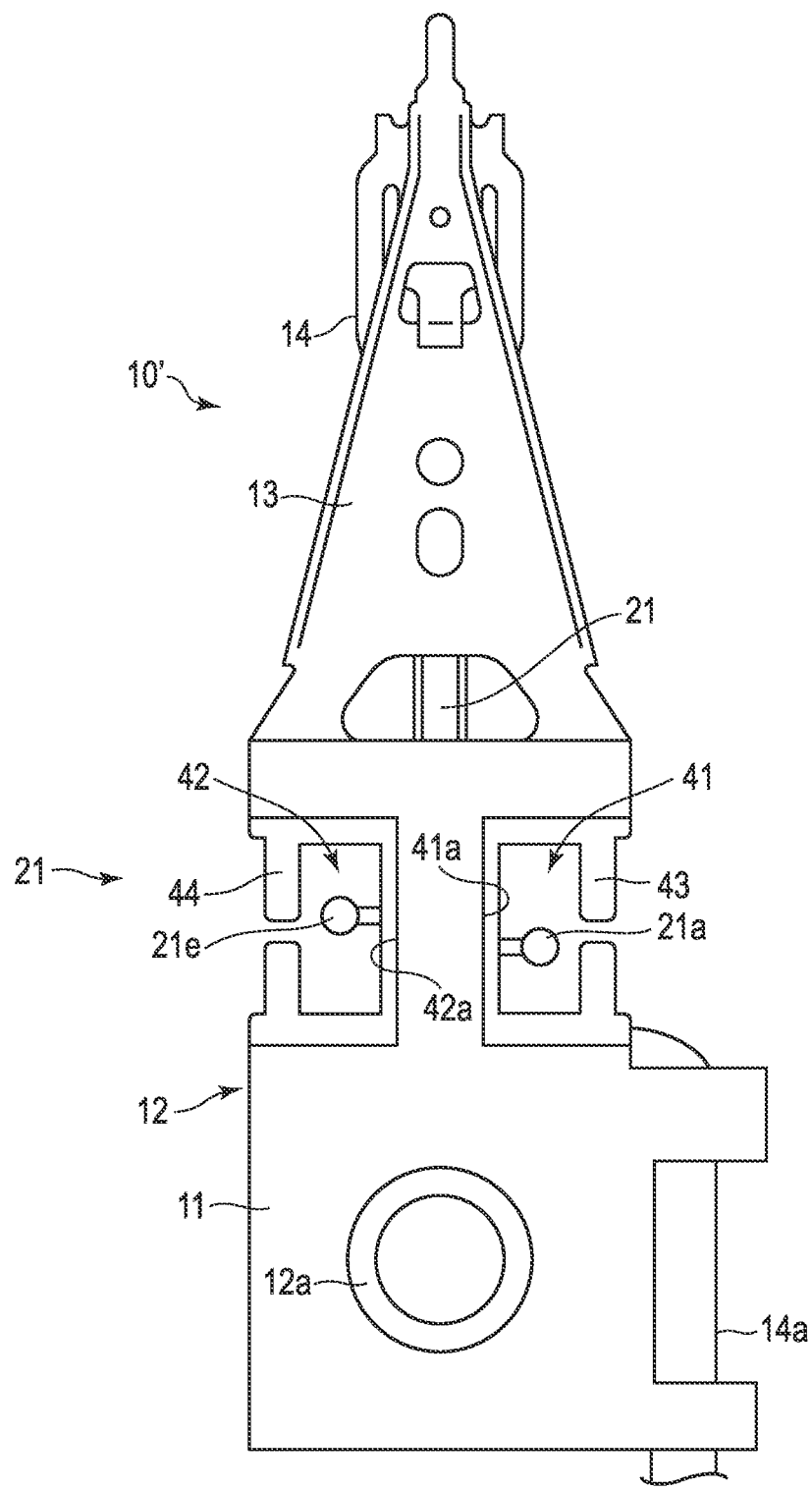
FIG. 4 is plan view of a work before a piezoelectric element is arranged in the disk drive suspension shown in FIG. 1.

FIG. 3 is a cross-sectional view showing the first actuator mounting portion 15. The second actuator mounting portion 16 is configured similarly to the first actuator mounting portion 15. FIG. 4 is a plan view showing the suspension 10 (referred to as a work 10') on which the piezoelectric elements 31 and 32 are to be arranged. A first opening portion 41 where the first piezoelectric element 31 is arranged and a second opening portion 42 where the second piezoelectric element 32 is arranged are formed on the base portion 12 of the work 10'.

As shown in FIG. 4, a support member 43 composed of a part (proximal part 13a) of the load beam 13 is formed inside the first opening portion 41. Similarly, a support member 44 composed of a part (proximal part 13a) of the load beam 13 is formed inside the second opening portion 42. The first piezoelectric element 31 is fixed to an inner surface 41a of the first opening portion 41 and the support member 43 by an adhesive 50 (shown in FIG. 1 and FIG. 3).

The second piezoelectric element 32 is fixed to an inner surface 42a of the second opening portion 42 and the support member 44 by the adhesive 50. The adhesive 50 is electrically insulative. An example of the adhesive 50 is formed from a photocuring epoxy resin responsive to ultraviolet rays. The adhesive 50 has a property of increasing viscosity with relatively little energy of applied ultraviolet rays and being cured with much energy of ultraviolet rays, and has a property of being cured by being heated. When hot air is blown to the adhesive 50, the surface of the adhesive 50 dries and is cured earlier than the inside.

The first actuator mounting portion 15 and the second actuator mounting portion 16 are configured substantially similarly to each other. For this reason, the first actuator mounting portion 15 shown in FIG. 3 will be represented and described below.

A first electrode 61 is provided in one of surfaces of the thickness direction of the piezoelectric element 31 as shown in FIG. 3. A second electrode 62 is provided on the other surface of the first piezoelectric element 31. The first electrode 61 is connected to a terminal 21a of the wiring portion 21 via a conductive material 70a. The wiring portion 21 includes an insulating layer 21b, a conductor 21c, and a cover layer 21d.

The second electrode 62 of the piezoelectric element 31 is electrically conductive with the base plate 11 via a conductive material 70b. The base plate 11 also functions as a conductor on the earth side. The conductive materials 70a and 70b are formed of the same conductive adhesive as each other and contain, for example, a binder formed of a thermosetting organic resin, and conductive particles mixed with the binder.

Next, an example of a process of mounting the piezoelectric elements 31 and 32 on the actuator mounting portions 15 and 16 will be disclosed.

Figure 5:
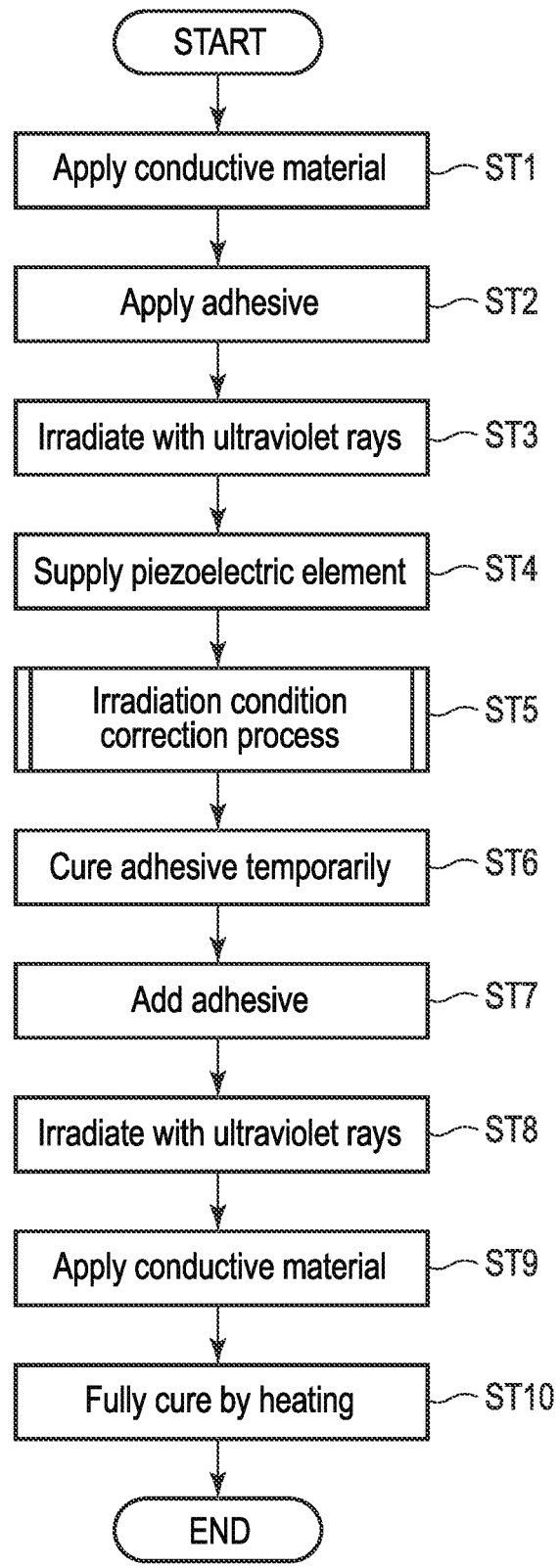
FIG. 5 is a flowchart showing an example of a manufacturing process of the disk drive suspension shown in FIG. 1.

FIG. 5 is a flowchart showing an example of a manufacturing process of one suspension 10. The piezoelectric elements 31 and 32 are mounted on the actuator mounting portions 15 and 16 through a series of step ST1 to ST10 shown in FIG. 5.

Figure 6:
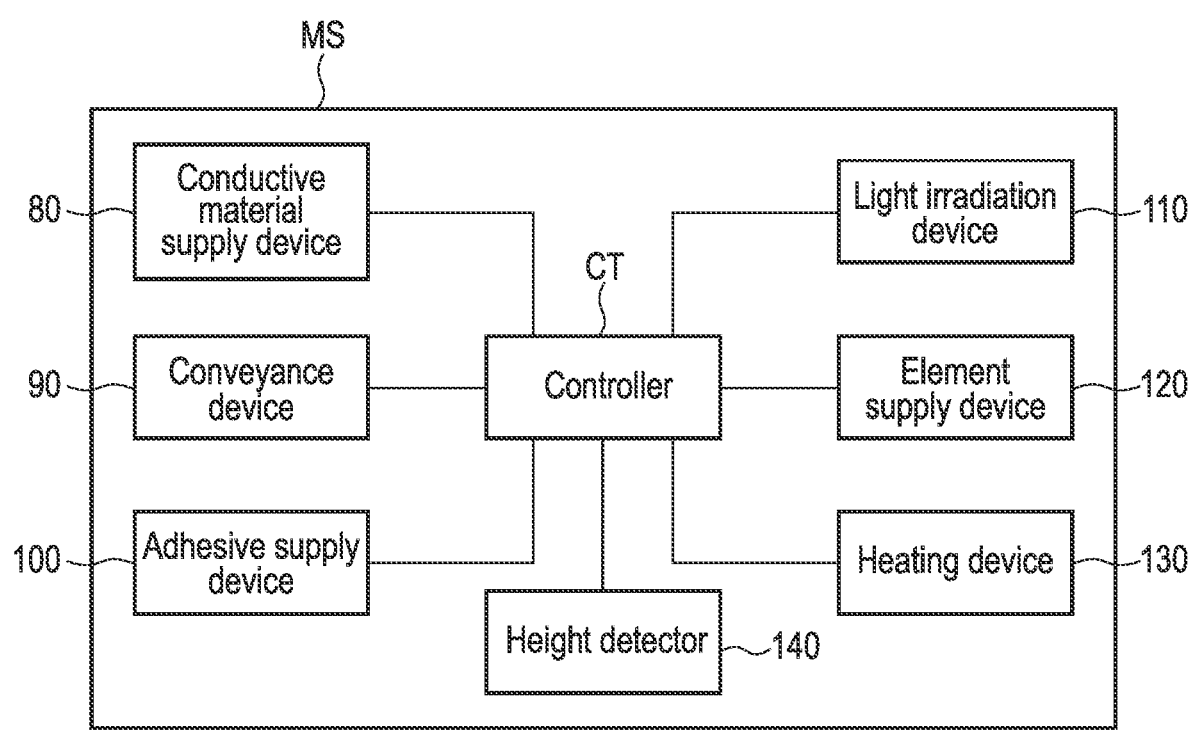
FIG. 6 is a block diagram showing a schematic configuration of the manufacturing apparatus for realizing the manufacturing process of FIG. 5.

FIG. 6 is a block diagram showing a schematic configuration of the manufacturing apparatus MS to realize the manufacturing process of FIG. 5. The manufacturing apparatus MS comprises a controller CT serving as a center of control, a conductive material supply device 80, a conveyance device 90, an adhesive supply device 100, a light irradiation device 110, an element supply device 120, a heating device 130, and a height detector 140. An example of the manufacturing process using these conductive material supply device 80, the conveyance device 90, the adhesive supply device 100, the light irradiation device 110, the element supply device 120, the heating device 130, and the height detector 140 is shown in FIG. 7, FIG. 8, FIG. 9, FIG. 10, and FIG. 11.

Details of steps ST1 to ST10 in the flowchart of FIG. 5 will be described below.

(1) Step ST1 (Process of Applying the Conductive Material 70a)

Figure 7:
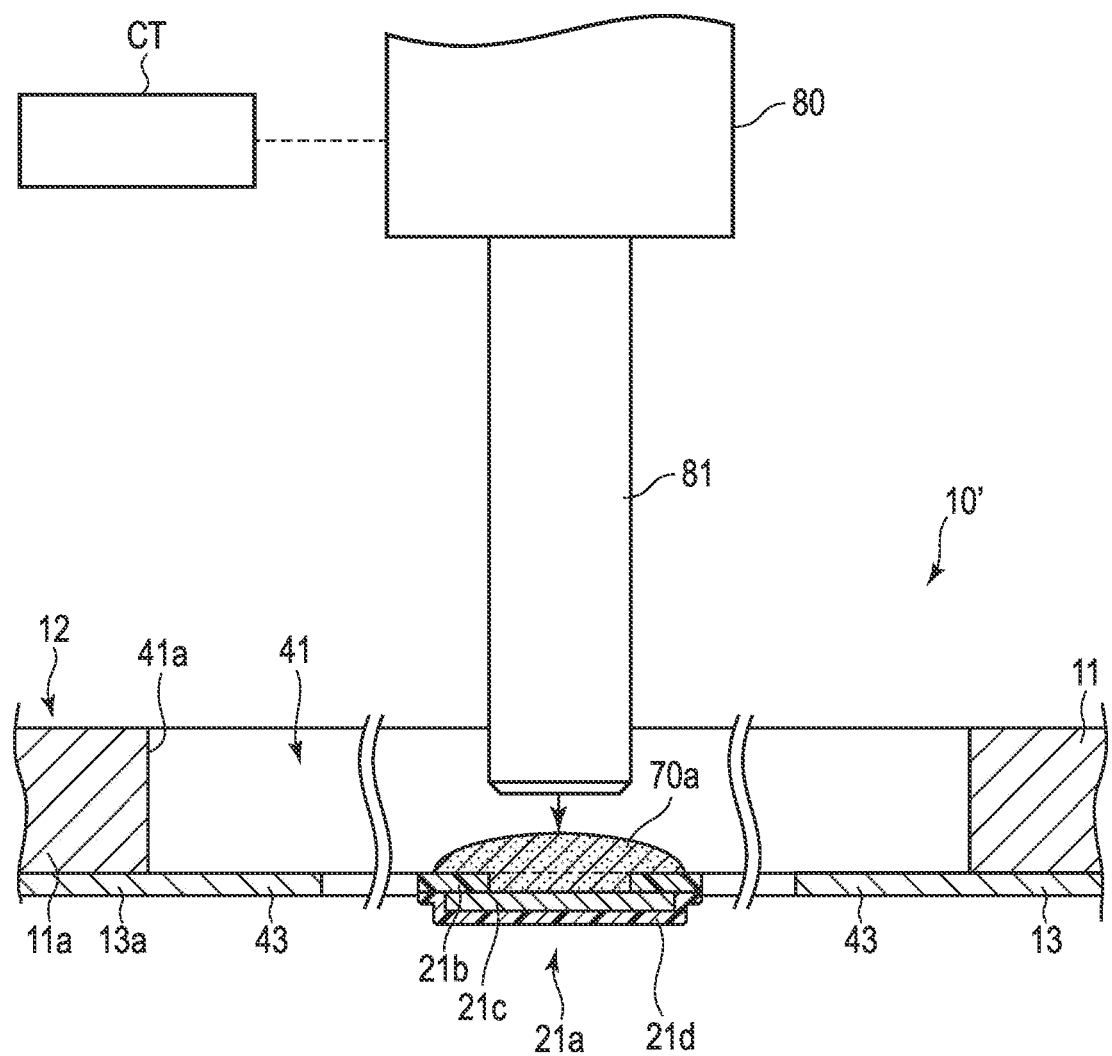
FIG. 7 is a cross-sectional view schematically showing parts of the actuator mounting portion and parts of a conductive material supply device.

FIG. 7 is a cross-sectional view schematically showing parts of the work 10' and parts of the conductive material supply device 80. For example, in step ST1, the conductive material 70a in an uncured paste state is applied to the conductor 21c of the terminal 21a by a nozzle 81 of the conductive material supply device 80 as shown in FIG. 7. A thermosetting adhesive nonreactive to ultraviolet rays, which is not cured when irradiated with ultraviolet rays, is used as the conductive material 70a.

Figure 8:
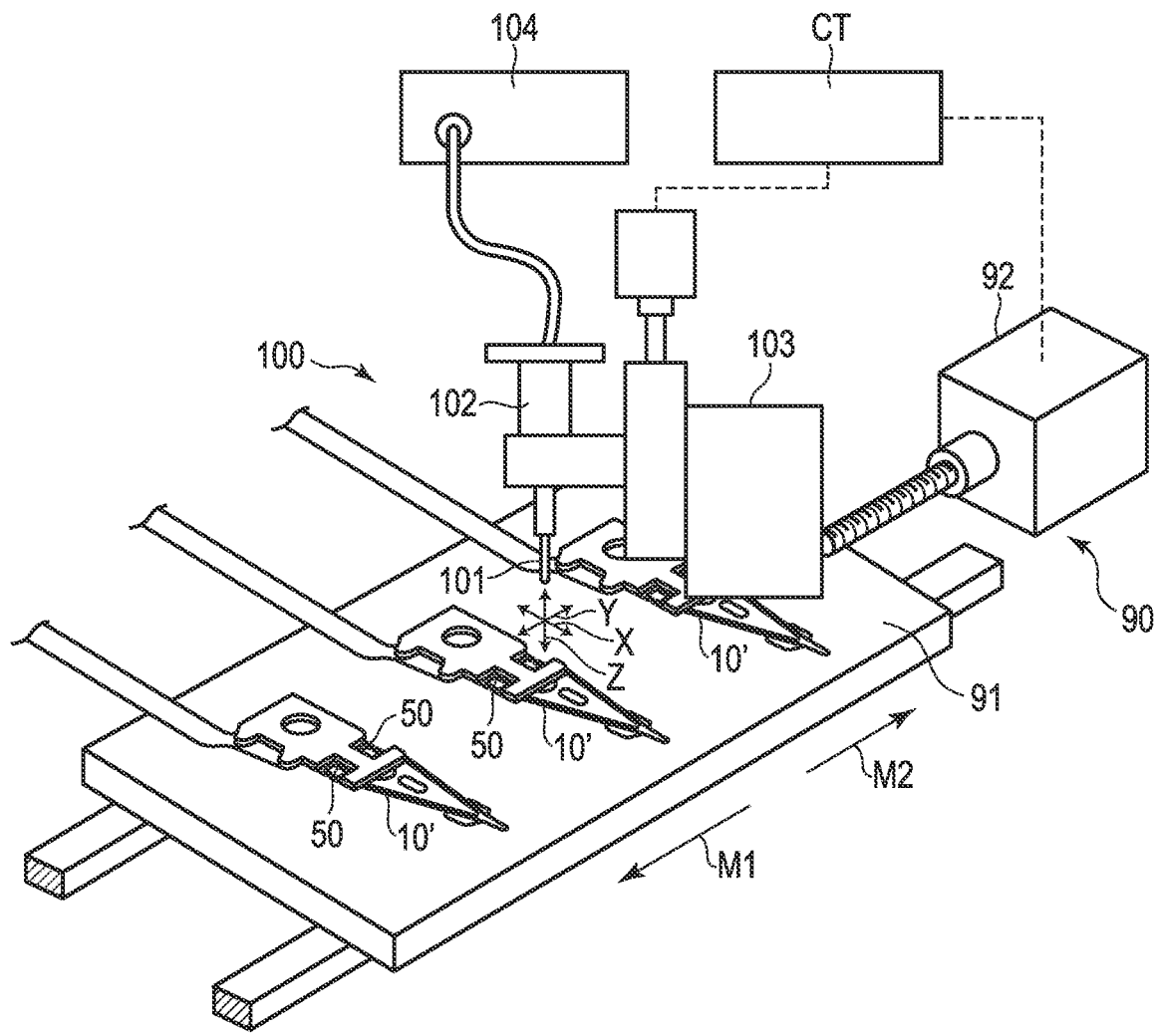
FIG. 8 is a perspective view schematically showing a transfer shuttle and an adhesive supply device.

Application of the conductive material 70a is executed for, for example, the work 10' which is conveyed by the conveyance device 90. FIG. 8 is a perspective view schematically showing the conveyance device 90 and the adhesive supply device 100. The conveyance device 90 comprises a conveyance shuttle 91 which holds a plurality of works 10' in predetermined intervals, and a drive mechanism 92 which moves the conveyance shuttle 91 in a conveying direction M1 at a predetermined pitch. The drive mechanism 92 can also urge the conveyance shuttle 91 to retreat in a direction indicated by an arrow M2. The conveyance shuttle 91 and the drive mechanism 92 configure conveyance means for moving the plurality of works 10' at a predetermined pitch in a predetermined direction.

(2) Step ST2 (Process of Applying the Adhesive)

In step ST2, the adhesive 50 is applied co the actuator mounting portions 15 and 16 by the adhesive supply device 100. The adhesive supply device 100 shown in FIG. 8 comprises a dispenser 102 including a nozzle 101, a movement mechanism 103 which moves the dispenser 102 in three-dimensional directions (indicated by arrows X, Y, and Z) to control the position of the nozzle 101, and an adhesive supply source 104. The liquid adhesive 50 discharged from the nozzle 101 is applied to the support members 43 and 44 of the actuator mounting portions 15 and 16.

(3) Step ST3 (Process of Irradiating with Ultraviolet Rays)

Figure 9:
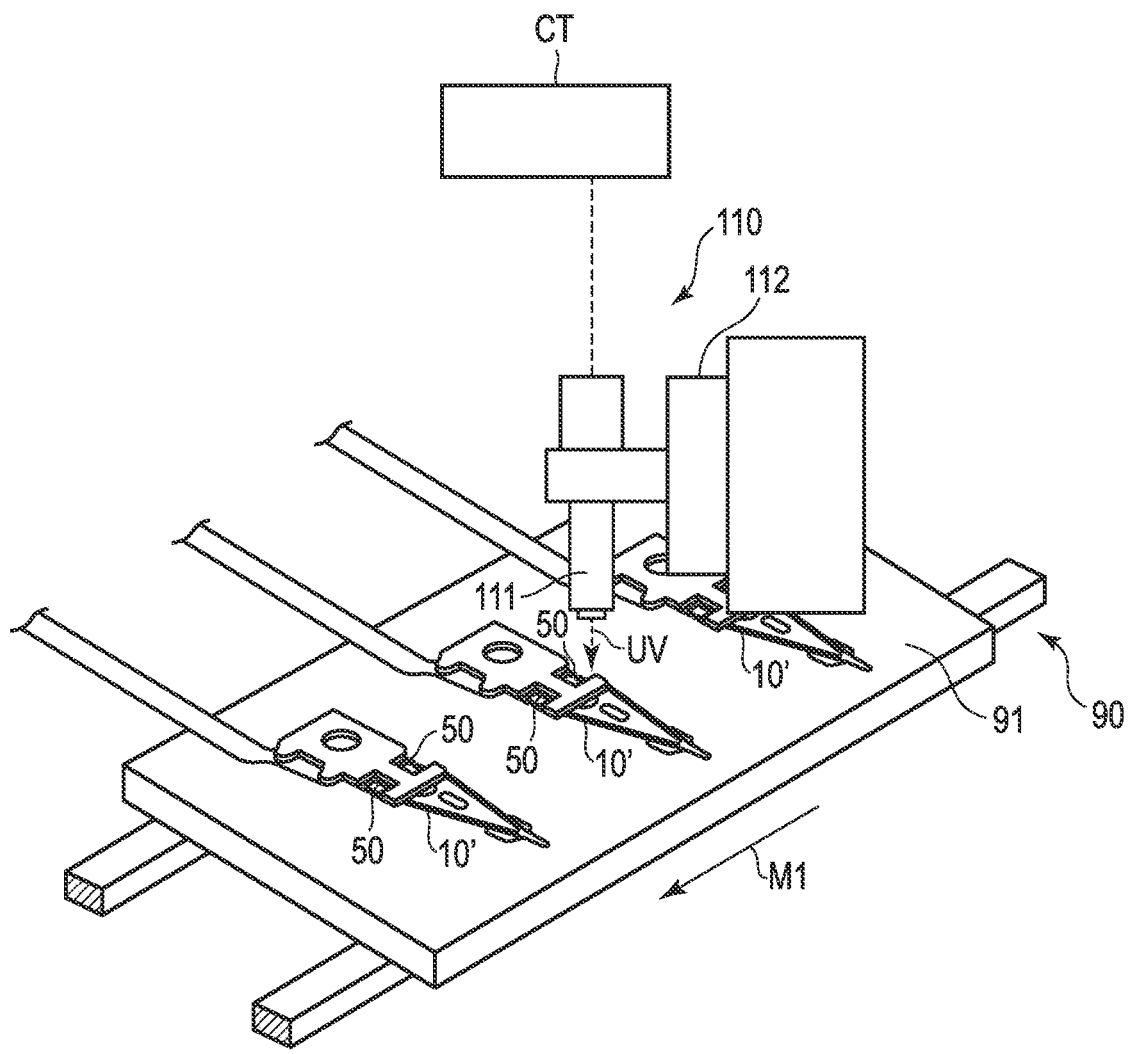
FIG. 9 is a perspective view schematically showing the transfer shuttle and a light irradiation device.

FIG. 9 is a perspective view schematically showing the conveyance shuttle 91 and the light irradiation device 110. In step ST3, the uncured adhesive 50 applied in step ST2 is irradiated with ultraviolet rays by the light irradiation device 110. For example, approximately 3 to 10 seconds have elapsed after applying the adhesive 50, the adhesive 50 is wet and spread, and then the ultraviolet irradiation is executed.

The light irradiation device 110 shown in FIG. 9 includes an irradiation head 111 which emits ultraviolet rays UV to the actuator mounting portions 15 and 16, and a holder 112 which supports the irradiation head 111. The viscosity of the adhesive 50 increases by irradiating the uncured adhesive 50 with ultraviolet rays. The irradiation timing of ultraviolet rays by the irradiation head 111 and the illumination of ultraviolet rays are controlled by the controller CT.

(4) Step ST4 (Process of Placing the Piezoelectric Element)

Figure 10:
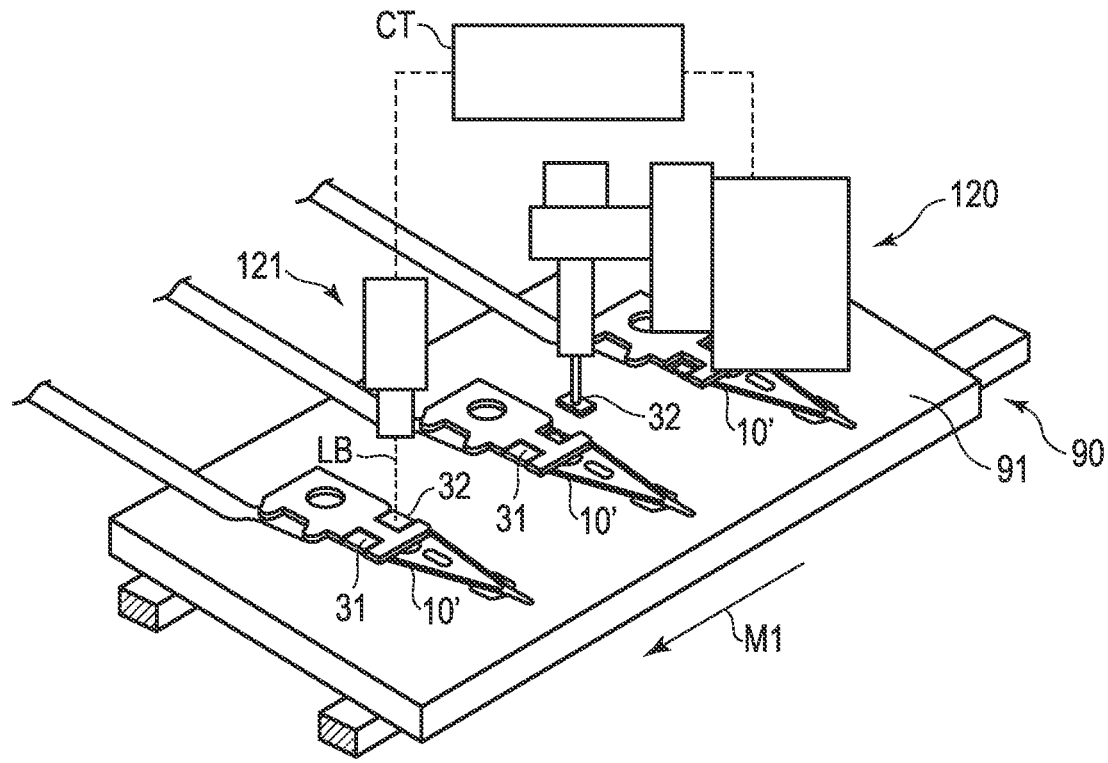
FIG. 10 is a perspective view schematically showing the transfer shuttle, a device supply device, and a height detector.

FIG. 10 is a perspective view schematically showing the element supply device 120 and a detector 121. In step ST4, the piezoelectric elements 31 and 32 are placed on the adhesive 50 of the actuator mounting portions 15 and 16 by the element supply device 120. At this time, the adhesive 50 is in a state that the viscosity has increased in advance in step ST3. For this reason, the piezoelectric elements 31 and 32 placed on the adhesive 50 is inhibited from moving from predetermined positions due to surface tension of the adhesive 50, vibration of the conveyance shuttle 91, and the like. In addition, the piezoelectric elements 31 and 32 are inhibited from moving downward by their own weight.

When the first piezoelectric element 31 is placed on the first actuator mounting portion 15 in step ST4, the electrode 61 on the lower surface of the first piezoelectric element 31 and the conductor 21c of the terminal 21a are brought into contact with each other via the uncured conductive material 70a. In addition, when the second piezoelectric element 32 is placed on the second actuator mounting portion 16, the electrode on the lower surface of the second piezoelectric element 32 and the conductor of the terminal 21e are brought into contact with each other via the uncured conductive material 70a.

(5) Step ST5 (Irradiation Condition Correction Process)

In step ST5, an irradiation condition correction process is executed. In this process, the height of the piezoelectric elements 31 and 32 placed on the actuator mounting portions 15 and 16 in step ST4 is detected by the height detector 140, and an irradiation condition of ultraviolet rays in step ST3 following the next time is corrected based on the result. As described herein, the "height" of the piezoelectric elements 31 and 32 means not the thickness of the piezoelectric elements 31 and 32 itself but, for example, the position of the surface on the second electrode 62 side of the piezoelectric elements 31 and 32 to the surfaces of the base plate 11 and the load beam 13. Such height can change, for example, according to the thickness of the adhesive 50 interposed between the piezoelectric elements 31 and 32 and the load beam 13 as shown in FIG. 3.

(6) Step ST6 (Process of Provisionally Curing the Adhesive)

In step ST6, the adhesive 50 is cured provisionally. As described herein, "provisionally curing" means curing the vicinity of the surface of the adhesive 50 to some extent before completely curing the adhesive 50 (fully curing) by the heating device 130 in step ST10.

For example, the vicinity of the surface of the adhesive 50 is cured to some extent by spraying a hot gas (air or inert gas) on the actuator mounting portions 15 and 16. The movement of the piezoelectric elements 31 and 32 is thereby stopped. As described herein, the hot gas is gas (for example, inert gas) heated to temperature sufficient to cure the adhesive 50 in a short time. However, step ST6 may be omitted depending on the conditions such as properties of the adhesive 50, and the like.

(7) Step ST7 (Process of Applying an Additional Adhesive)

In step ST7, an additional adhesive is supplied to the actuator mounting portions 15 and 16. For example, the adhesive 50 is applied as needed between outer peripheries of the piezoelectric elements 31 and 32, and the inner surface 41a and 42a of the opening portions 41 and 42. The device which applies the adhesive 50 may be the same as the adhesive supply device 100 shown in FIG. 8. However, step ST7 can be omitted depending on the property of the adhesive 50 and the conditions in the process.

(8) Step ST8 (Additional Process of Irradiating with Ultraviolet Rays)

In step ST8, the adhesive added in step ST7 is irradiated with ultraviolet rays. The device used at this time may be the same as the light irradiation device 110 shown in FIG. 9. The viscosity of the adhesive increases by emitting ultraviolet rays to an added adhesive. The piezoelectric elements 31 and 32 can be fixed further certainly by the additional adhesive. However, step ST8 may be omitted depending on the conditions in the process.

(9) Step ST9 (Process of Applying the Conductive Material 70b)

In step ST9, the uncured conductive material 70b is applied between the electrode 62 on the upper surface of the first piezoelectric element 31 and the base plate 11. The uncured conductive material 70b is also applied between the electrode on the upper surface of the second piezoelectric element 32 and the base plate 11. The device which applies the conductive material 70b may be the same as the conductive material supply device 80 shown in FIG. 7.

(10) Step ST10 (the Process of Fully Curing the Adhesive)

Figure 11:
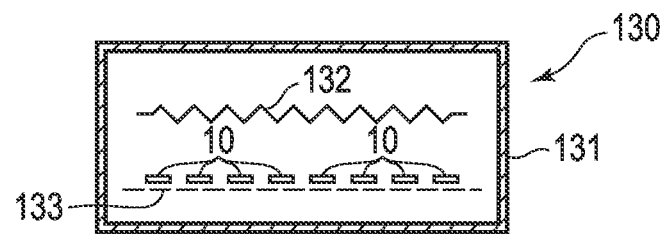
FIG. 11 is a cross-sectional view schematically showing a heating device.

FIG. 11 is a cross-sectional view schematically showing the heating device 130. In step ST10, a plurality of suspensions 10 are conveyed to the heating device 130. The heating device 130 comprises a heating source such as a heater 132 inside the device body 131, and simultaneously heats a plurality of suspensions 10 placed on a support body 133 by batch processing. The heater 132 heats the suspension 10 at a temperature suitable for both of the adhesive 50 and the conductive materials 70a and 70b to be cured. The temperature to neat is lower than or equal to the Curie point of the piezoelectric elements 31 and 32, preferably lower than or equal to a half of the Curie point.

In step ST10, the adhesive 50 is fully heated and the conductive materials 70a and 70b are also cured by simultaneously curing the adhesive 50 and the conductive materials 70a and 70b. As described herein, "fully curing" means a state in which a practical fixation strength is obtained by curing not only the vicinity of the surface of the adhesive 50, but also the inside of the adhesive 50.

The adhesive 50 is cured and the piezoelectric elements 31 and 32 are fixed to the actuator mounting portions 15 and 16 through a series of the manufacturing processes described above. The conductive material 70a is cured and a connected state between the piezoelectric elements 31 and 32 and the terminals 21a and 21e is thereby fixed. In addition, the conductive material 70b is cured and a connected state between the piezoelectric elements 31 and 32 and the base plate 11 is thereby fixed.

The uncured adhesive 50 has fluidity to some extent even if the viscosity increases through step ST3. For this reason, when the piezoelectric elements 31 and 32 are placed on the adhesive 50 in step ST4, the piezoelectric elements 31 and 32 are going to move downward by their own weight. Thus, the height of the piezoelectric elements 31 and 32 becomes smaller as the viscosity of the adhesive 50 is smaller.

FIG. 12 shows a relationship between the height and the sway frequency of the piezoelectric elements 31 and 32 arranged on the actuator mounting portions 15 and 16. In FIG. 12, a horizontal axis indicates the height [mm] of the piezoelectric elements 31 and 32, and zero is a reference height (target value) of the piezoelectric elements 31 and 32. In FIG. 12, a vertical axis indicates a resonance frequency [Hz] of the sway direction. Even if the height of the piezoelectric elements 31 and 32 is too large or too small, the peak frequency of the sway direction fluctuates, which is not desirable as the characteristic of the suspension 10.

To make the height of the piezoelectric elements 31 and 32 close to the reference height, it is effective to control the viscosity of the adhesive 50 at the time of arranging the piezoelectric elements 31 and 32 in step ST4 to a suitable value. In the present embodiment, the viscosity of the adhesive 50 is controlled by correcting the irradiation condition of the ultraviolet rays by the irradiation condition correction process in step ST5.

Figure 13:
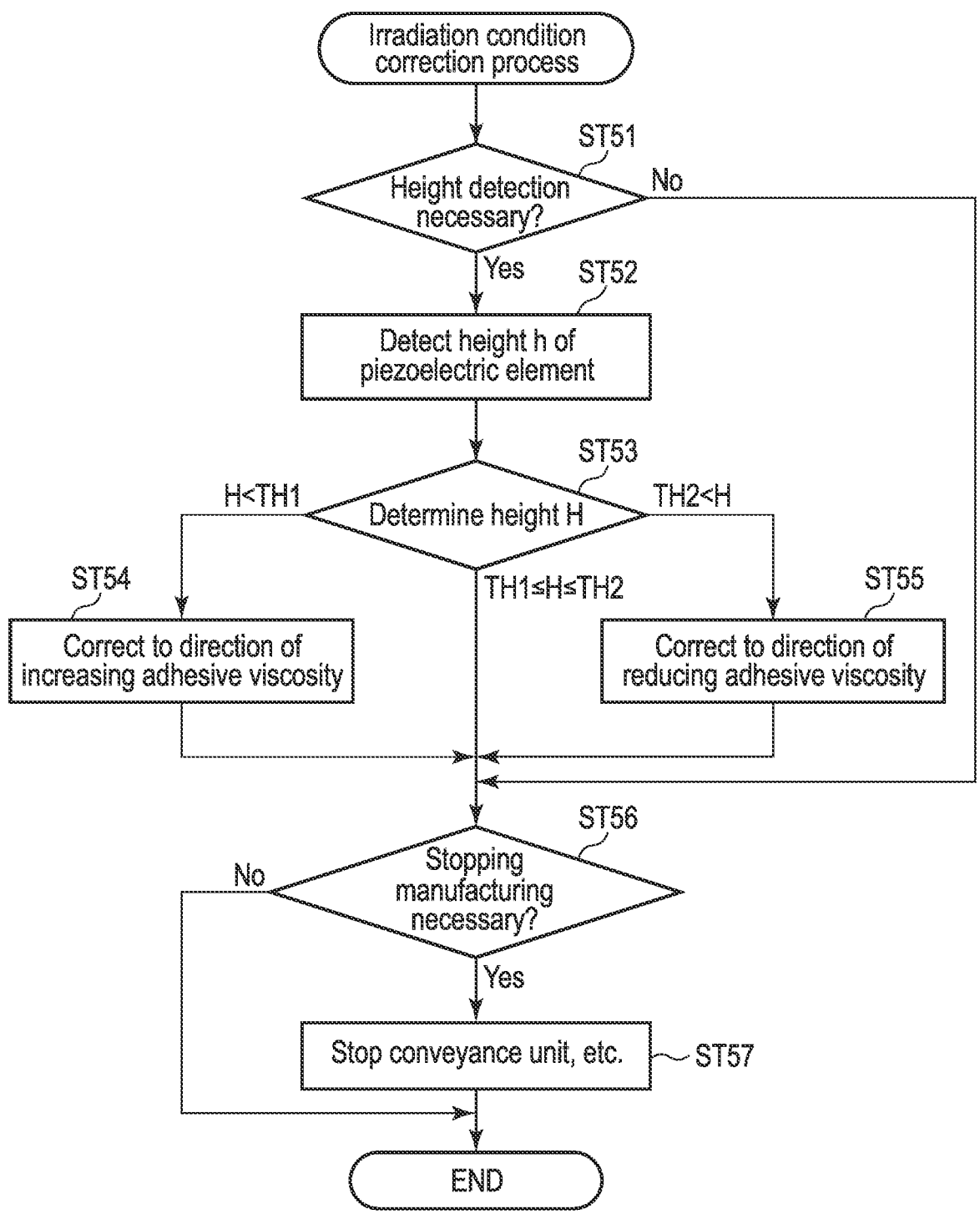
FIG. 13 is a flowchart showing an example of the irradiation condition correction process.
Figure 14:
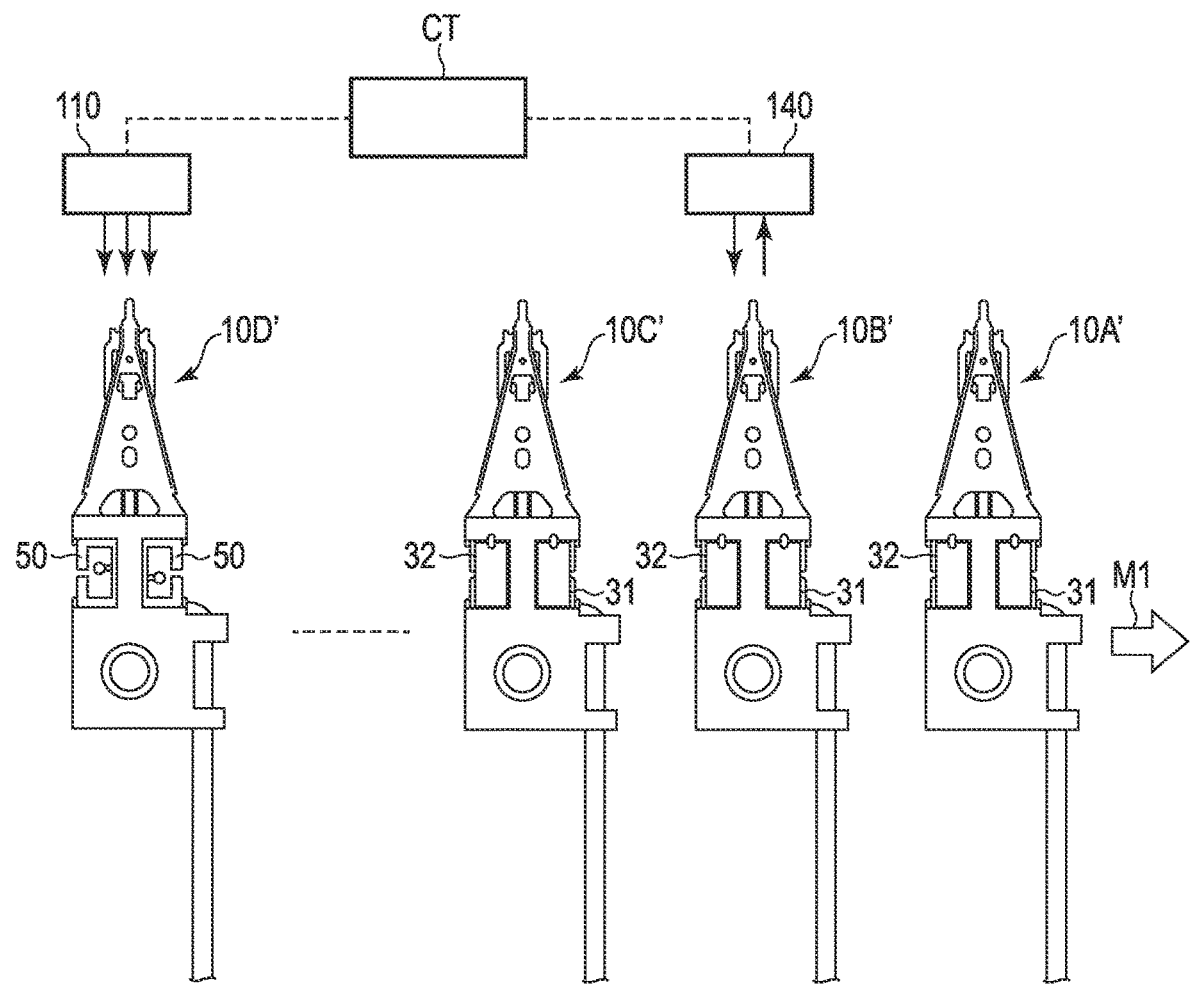
FIG. 14 is a schematic diagram showing an example of the irradiation condition correction process.

FIG. 13 is a flowchart showing an example of the irradiation condition correction process. In addition, FIG. 14 is a schematic diagram showing an example of the irradiation condition correction process. In FIG. 14, a plurality of works 10' (10A', 10B', 10C', and 10D') conveyed to the conveying direction M1 by the above-described conveyance device 90, the light irradiation device 110, the height detector 140, and the controller CT are shown.

The work 10B' is at the position to be detected by the height detector 140, and the work 10D' is at the position of the ultraviolet radiation by the light irradiation device 110. The work 10A' is on the downstream side of the detection position, and the work 10C' is present between the detection position and the irradiation position. Other works 10' may be further interposed between the work 10C' and the work 10D'.

The irradiation condition correction process is executed for the work 10' which reaches the position of detection by the height detector 140, by the controller CT.

First, in step ST51, it is determined whether height detection of the work 10' which reaches the position of detection by the height detector 140 is necessary or not. When the ultraviolet irradiation to the work 10' (step ST3) is executed after the correction of the irradiation conditions just before the irradiation, it is determined that the height detection is necessary (Yes in step ST51). In contrast, when the ultraviolet irradiation to the work 10' (step ST3) is executed before the correction of the irradiation conditions just before the irradiation, it is determined that the height detection is unnecessary (No in step ST51).

In the example of FIG. 14, when the irradiation condition is corrected in the irradiation condition correction process for the work 10A' and when the work 10B' passes at the irradiation position at the time of this correction, the adhesive 50 of the work 10B' is irradiated with ultraviolet rays by the light irradiation device 110 under the irradiation condition before the correction. Thus, since the current irradiation condition is not reflected on the work 10B', it is determined that the height detection of the work 10B' is unnecessary. In contrast, when the adhesive 50 of the work 10B' is irradiated with ultraviolet rays by the light irradiation device 110 after the irradiation condition is corrected in the previous irradiation condition correction process for the work 10A' or the work 10' on the downstream side from the work 10A', it is determined that the height detection of the work 10B' is necessary.

When it is determined that the height detection is necessary, step ST52 is executed. In step ST52, the height h of at least one of the piezoelectric elements 31 and 32 of the work 10' (work 10B' in the example of FIG. 14) at the detection position is detected by the height detector 140. For example, the height detector 140 detects a height h by emitting a laser beam LB to a surface of at least one of the piezoelectric elements 31 and 32 and receiving the reflected light as shown in FIG. 10. The height detection is not limited to this method, but the height detector 140 may detect the height h by capturing the image of at least one of the piezoelectric elements 31 and 32 and analyzing this.

Next, in step ST53, the height H is compared with threshold values TH1 and TH2. Details will be described later with reference to FIG. 15A, FIG. 15B, FIG. 16A, FIG. 16B, FIG. 17A, and FIG. 17B, but a height H is determined based on the height h detected in step ST52. The first threshold value TH1 indicates a lower limit of the height H, and the second threshold value TH2 indicates an upper limit of the height H. These threshold values TH1 and TH2 are determined within a permissible range when the suspension 10 exerts the given performance. For example, a middle value between the threshold values TH1 and TH2 is the above-mentioned reference height (target value).

When the height H is smaller than the first threshold value TH1 (H<TH1), increase of the viscosity of the adhesive 50 caused by the ultraviolet radiation of the light irradiation device 110 is insufficient. Thus, the irradiation condition is corrected to a direction of increasing the viscosity of the adhesive 50 in step ST54.

In contrast, when the height H is more than the second threshold value TH2 (TH2<H), the viscosity of the adhesive 50 increases too much by the ultraviolet irradiation of the light irradiation device 110. Thus, the irradiation condition is corrected to a direction of reducing the viscosity of the adhesive 50 in step ST55.

When the height H is more than or equal to the first threshold value TH1 and less than or equal to the second threshold value TH2 (TH1<H<TH2), the viscosity of the adhesive 50 after the ultraviolet irradiation is within a desirable range. At this time, the irradiation condition is not corrected.

Examples of the irradiation conditions are the irradiation time [sec] and illuminance [mW/cm$^2$] of ultraviolet rays, and a quantity of light [mJ] that is the value obtained by multiplying the irradiation time by the illuminance. That is, at least one of the irradiation time, the illuminance, and the quantity of light is raised in step ST54, and at least one of the irradiation time, the illuminance, and the quantity of light is lowered in step ST55. In step ST54, the degree of raising at least one of the irradiation time, the illuminance, and the quantity of light may be made larger as a difference between the height H and the reference height, is larger. In addition, in step ST55, the degree of lowering at least one of the irradiation time, the illuminance, and the quantity of light may be made larger as a difference between the height H and the reference height is larger.

When the irradiation time is changed, the conveyance speed of a plurality of works 10' also needs to be adjusted. Thus, the only illuminance may be corrected in steps ST54 and ST55. In this case, adjustment of the conveyance speed is unnecessary since the current or voltage input to the irradiation head 111 of the light irradiation device 110 voltage needs only to be changed.

After the correction of steps ST54 and ST55, the work 10' which is a target of the process in step ST3 is irradiated with ultraviolet rays by the light irradiation device 110 under the ultraviolet irradiation after the correction.

After steps ST53 to ST55, it is determined whether the manufacturing apparatus MS needs to be stopped or not in step ST56. Examples of stopping the manufacturing apparatus MS are a case where the correction of step ST54 is successively executed at a first determined number of times in the latest irradiation condition correction process for a plurality of works 10' and a case where the correction of step ST55 is successively executed at a second determined number of times.

As exemplified with reference to FIG. 14, for example, when the first determined number of times is three times and the correction of step ST54 is executed in each of the irradiation condition adjustment processes of the respective works 10A', 10B', and 10C', it is determined that the manufacturing apparatus MS needs to be stopped. Alternatively, for example, when the second determined number of times is three times and the correction of step ST55 is executed in the irradiation condition adjustment processes for the respective works 10A', 10B', and 10C', it is determined that the manufacturing apparatus MS needs to be stopped. The first determined number of times and the second determined number of times do not need to be the same and may be different values.

When it is determined that the manufacturing apparatus MS needs to be stopped (Yes in step ST56), operations of the conductive material supply device 80, the conveyance device 90, the adhesive supply device 100, the light irradiation device 110, the element supply device 120, and the like are stopped in step ST57. At this time, warning may be emitted by voice output from a speaker, display on a display unit, information output to an external device communicably connected to the manufacturing apparatus MS, and the like.

After step ST57 or when it is determined that the manufacturing apparatus MS does not need to be stopped in step ST56 (No in step ST56), the irradiation condition correction process is ended.

Figure 15A:
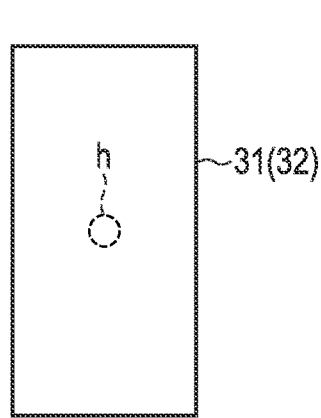
FIG. 15A and FIG. 15B are diagrams schematically showing examples of a detection position of the height of the piezoelectric device.
Figure 15B:
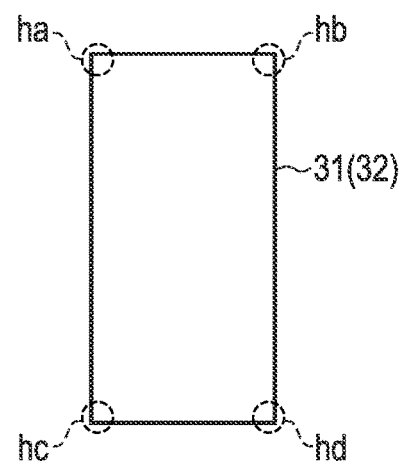

FIG. 5A and FIG. 15B are diagrams schematically showing examples of the detection position of the height h used to derive the height H. As shown in FIG. 15A, the height detector 140 may detect the height h of a central part of either of the piezoelectric elements 31 and 32 in step ST52. In this case, the height H may be equal to the height h.

Alternatively, as shown in FIG. 15B, the height detector 140 may detect heights h (ha, hb, hc, and hd) of four corners of either of the piezoelectric elements 31 and 32 in step ST52. In this case, the height H may be an average value of the heights ha, hb, hc, and hd of these four corners.

FIG. 16A and FIG. 16B are diagrams schematically showing other examples of the detection position of the height h used to derive the height H. As shown in FIG. 16A, the height detector 140 may detect heights h (h1, h2) of central parts of both the piezoelectric elements 31 and 32 in step ST52. In this case, the height H may be an average value of the heights h1 and of h2.

Alternatively, as shown in FIG. 16B, the height detector 140 may detect the heights h (h1a, h1b, h1c, h1d, h2a, h2b, h2c, and h2d) of four corners of both the piezoelectric elements 31 and 32 in step ST52. In this case, the height H may be an average value of these heights h1a to h2d.

FIG. 17A and FIG. 17B are diagrams schematically showing the other examples of the detection position of the height h used to derive the height H. The height H can also be determined based on the heights h detected from the piezoelectric elements 31 and 32 of the plurality of work 10'.

For example, the height H may be an average value of the heights h1 and h2 of the central parts of the piezoelectric elements 31 and 32 detected in the work 10A', 10B', and 10C' (illustration of the work 10B' is omitted) as shown in FIG. 17A. Alternatively, the height H may be an average value of heights h1a, h1b, h1c, h1d, h2a, h2b, h2c, and h2d of four corners of the piezoelectric elements 31 and 32 detected in each of the works 10A', 10B', and 10C' as shown in FIG. 17B.

Figure 18:
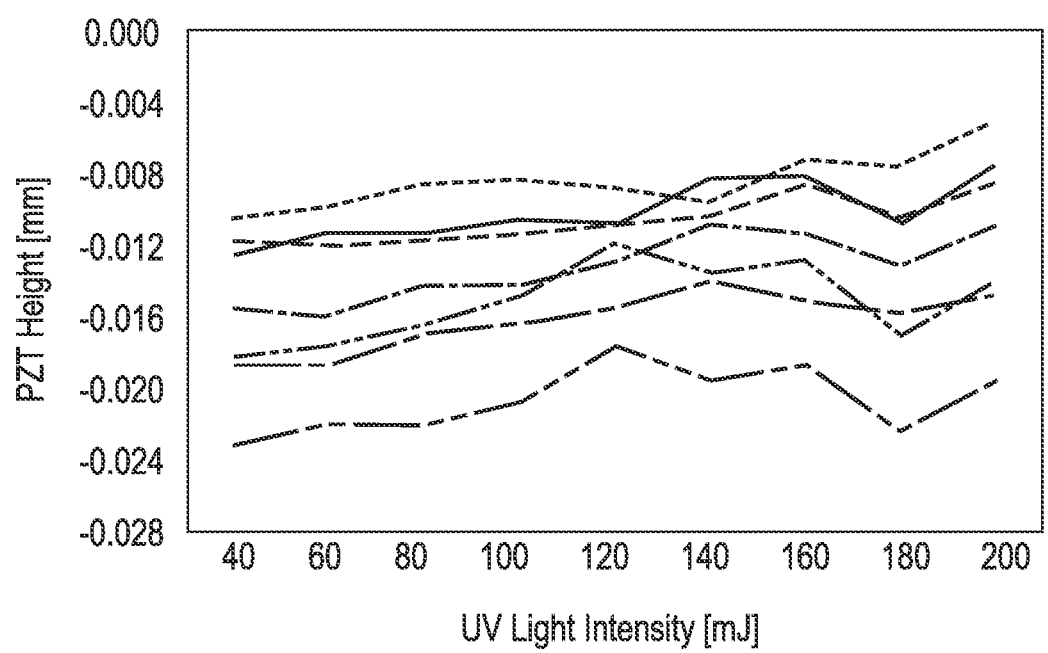
FIG. 18 is a graph showing an example of a relationship between a quantity of ultraviolet rays applied to an adhesive and a height of the piezoelectric element.

FIG. 18 is a graph showing an example of a relationship between the quantity of light [mJ] of ultraviolet rays emitted to the adhesive 50 in step ST3 and the height [mm] of the piezoelectric elements 31 and 32. The data on which this graph is based has been obtained by manufacturing a plurality of suspensions 10 while varying the quantity of light of ultraviolet rays emitted to the adhesive 50 in step ST3, and measuring the height of a different position (one of four corners) of the piezoelectric elements 31 and 32. The line of each line type corresponds to the measurement position of the position in the piezoelectric elements 31 and 32.

It can be understood from this graph that the heights of the piezoelectric elements 31 and 32 tend to increase in accordance with increase in the quantity of light of the ultraviolet rays. Therefore, when the quantity of light is increased by varying the irradiation time, the illuminance, and the like in step ST54, the height of the piezoelectric elements 31 and 32 can be corrected to an increase direction. In addition, when the quantity of light is reduced by varying the irradiation time, the illuminance, and the like in step ST55, the height of the piezoelectric elements 31 and 32 can be corrected to a decrease direction.

According to the above-described manufacturing method of the present embodiment, the viscosity of the adhesive 50 increases in step ST3 (ultraviolet irradiation). The displacement of the positions of the piezoelectric elements 31 and 32 is thereby inhibited. For example, the movement of the piezoelectric elements 31 and 32 is avoided by vibration when the work 10' is conveyed by the conveyance shuttle 91. Thus, the work 10' is introduced into the heating device 130 under the conditions that the piezoelectric elements 31 and 32 are held at predetermined positions. Then, the adhesive 50 is heated and fully cured by the heating device 130. For this reason, the piezoelectric elements 31 and 32 can be exactly fixed to predetermined positions of the actuator mounting portions 15 and 16.

The viscosity of the adhesive 50 applied by the adhesive supply device 100 can change chronologically in the processes of sequentially manufacturing a large number of suspensions 10. In general, the viscosity tends to increase as the time elapses from the start of manufacturing. For this reason, even if the viscosity of the adhesive 50 after the ultraviolet radiation in step ST3 indicates an appropriate value at the time of starting the manufacturing, the viscosity may increase and the height of the piezoelectric elements 31 and 32 may be largely shifted from the reference value as the time elapses.

In this regard, in the present embodiment, the viscosity of the adhesive 50 is adjusted to an appropriate value by correcting the irradiation condition of ultraviolet rays based on the height of the piezoelectric elements 31 and 32 in the irradiation condition correction process of step ST5. Thus, even if the viscosity of the diachronic adhesive 50 is varied chronologically, the height of the piezoelectric elements 31 and 32 can be made close to a reference value and the dispersion of the sway vibration mode can be avoided.

As described with reference to FIG. 15A, if one point of either of the piezoelectric elements 31 and 32 is used as a target of the height detection, the process required for the height detection can be shortened. As described with reference to FIG. 15B, if a plurality of points (for example, four corners) of the piezoelectric elements 31 and 32 are used as targets of the height detection and an average value of the heights of these points is calculated, the influence caused by bending and error detection of the piezoelectric elements 31 and 32 can be inhibited and the accuracy of determination of the necessity to correct the irradiation condition can be raised. In addition, as described with reference to FIG. 16A, FIG. 16B, FIG. 17A, and FIG. 17B, if the average value of the heights of the plurality of piezoelectric elements 31 and 32 is calculated, the accuracy of determination of the necessity to correct the irradiation condition can be further raised.

If the work 10' where the ultraviolet radiation to the adhesive 50 (step ST3) is executed before correction of the previous irradiation condition, i.e., the work 10' which is irradiated with ultraviolet rays under conditions different from the current irradiation conditions is excluded from the target of height detection, similarly to step ST51, unnecessary feedback can be inhibited and desirable irradiation conditions can be set.

When the correction of step ST54 is executed sequentially many times or when the correction of step ST55 is executed sequentially many times, the viscosity adjustment based on the correction of the irradiation conditions may not function normally due to some troubles. In this regard, if the manufacturing apparatus MS is stopped when the correction of the irradiation conditions to the same direction is executed sequentially at a determined number of times similarly to steps ST56 and ST57, manufacturing of defective products can be inhibited and an operator can be notified of abnormality.

FIG. 19 is a perspective view showing parts of a suspension 10A according to a second embodiment. Common parts of common portions of this suspension 10A to those of the suspension 10 of the first embodiment are denoted by common reference numerals.

The suspension 10A according to the second embodiment comprises a load beam 13 and a flexure 14, similarly to the suspension 10 of the first embodiment. A slider 23 is mounted on a tongue 22 formed on the flexure 14.

Actuator mounting portions 15 and 16 are provided on both sides of the slider 23, respectively. A first piezoelectric element 31 is placed on the first actuator mounting portion 15A.

Figure 20:
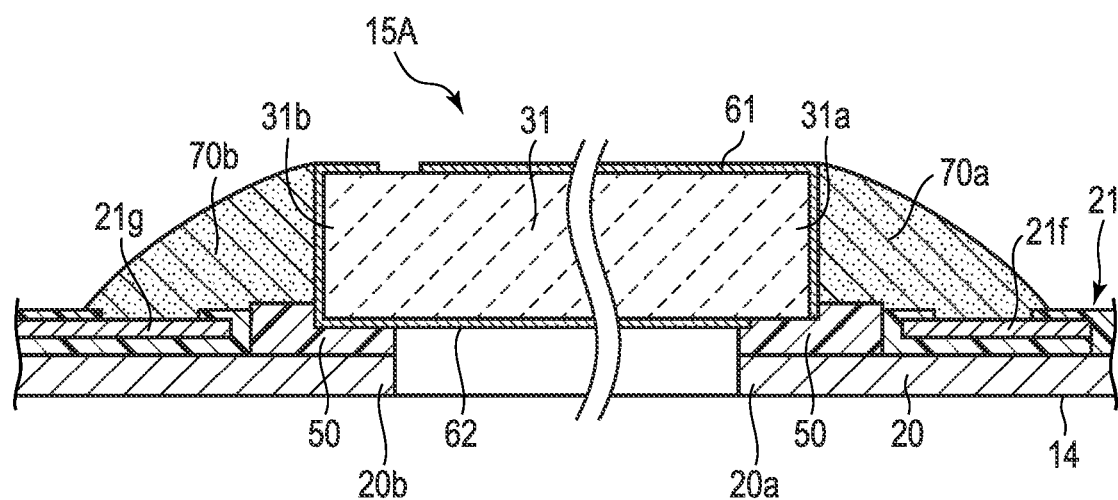
FIG. 20 is a cross-sectional view showing an actuator mounting portion shown in FIG. 19.

FIG. 20 is a cross-sectional view showing the first actuator mounting portion 15A. The second actuator mounting portion 16A has substantially the same structure as the first actuator mounting portion 15A. For this reason, the first actuator mounting portion 15A will be described below and the description of the second actuator mounting portion 16A will be omitted.

As shown in FIG. 20, an end part 31a of the piezoelectric element 31 is fixed to a first support part 20a of a metal base 20 by an adhesive 50. The other end part 31b of the piezoelectric element 31 is fixed to a second support part 20b of the metal base 20 by the adhesive 50. The adhesive 50 is electrically insulative. A first electrode 61 of the piezoelectric element 31 is electrically conductive with a first conductor 21f of the first actuator mounting portion 15A via a conductive material 70a. A second electrode 62 of the piezoelectric element 31 is electrically conductive with a second conductor 21g of the actuator mounting portion 15A via a conductive material 70b.

Figure 21:
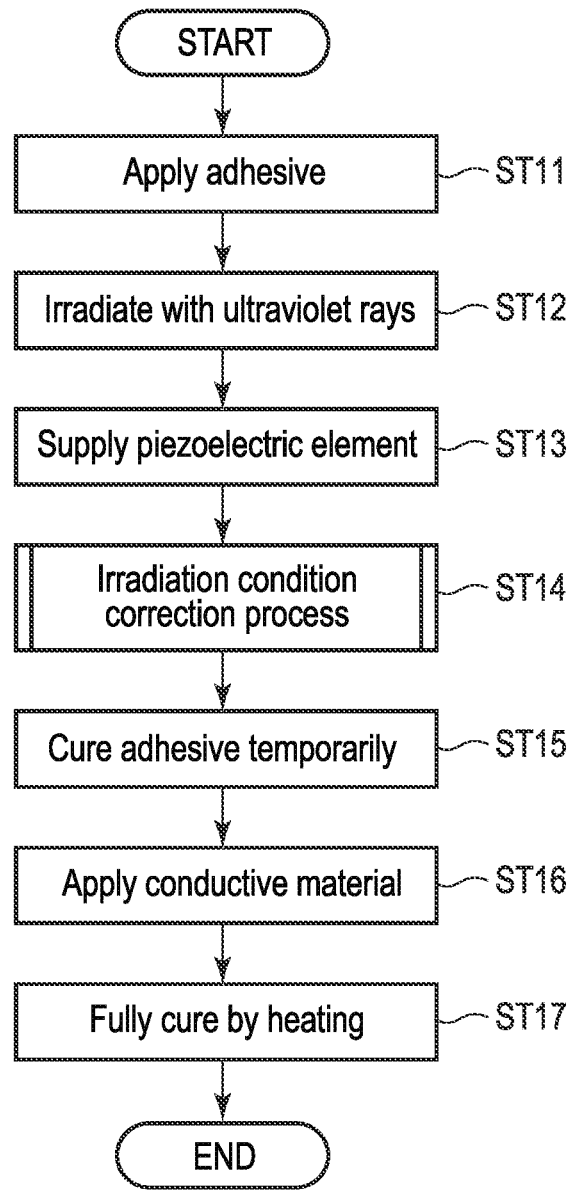
FIG. 21 is a flowchart showing an example of a manufacturing process of the disk drive suspension shown in FIG. 19.

FIG. 21 is a flowchart showing an example of a manufacturing process of the suspension 10A.

In step ST1l (process of applying an adhesive), an uncured adhesive 50 is applied to the support parts 20a and 20b of the actuator mounting portions 15A and 16A.

In step ST12 (process of irradiating with ultraviolet rays), the viscosity of the adhesive 50 is increased by irradiating the adhesive 50 with ultraviolet rays.

In step ST13 (process of placing piezoelectric elements), the piezoelectric elements 31 and 32 are placed on the adhesive 50 applied to the actuator mounting portions 15A and 16A. Since the viscosity of the adhesive 50 is increased in step ST12, movement of the piezoelectric elements 31 and 32 from predetermined positions is inhibited.

In step ST14 (irradiation condition correction process), the same process as that shown in FIG. 13 is executed. Thus, the height of the piezoelectric elements 31 and 32 is detected, and the irradiation conditions of the ultraviolet rays to be emitted to an adhesive of a subsequent work are corrected based on the height.

In step ST15 (temporarily curing the adhesive), the adhesive 50 is cured temporarily. For example, the vicinity of the surface of the adhesive 50 is cured to some extent by spraying a hot gas on the actuator mounting portions 15A and 16A. The movement of the piezoelectric elements 31 and 32 is thereby stopped. However, step ST15 may be omitted depending on the conditions such as properties of the adhesive 50, and the like.

In step ST16 (process of applying the conductive material), uncured conductive materials 70a and 70b are applied to the first actuator mounting portion 15A. In addition, the uncured conductive materials 70a and 70b are applied to the second actuator mounting portion 16A.

In step ST17 (fully curing process), a plurality of suspensions 10A are contained in the heating device 130 (shown in FIG. 11). The adhesive 50 and the conductive materials 70a and 70b are cured by heating these suspensions 10A inside the heating device 130. The suspension 10A of this embodiment can achieve an advantage in particularly improving the resonance characteristic of the yaw mode by fixing the piezoelectric elements 31 and 32 at the predetermined positions.

It goes without saying that the present invention can be carried out by variously modifying not only specific aspects of the suspensions, but also specific aspects of the elements configuring the actuator mounting portion such as the piezoelectric elements, adhesives, and conductive materials. In addition, the conveyance device, the adhesive supply device, the light irradiation device, the element supply device, the heating device, and the like can also be carried out in various aspects.

In each embodiment, it is exemplified that the adhesive 50 is the photocuring resin responsive to ultraviolet rays. However, the adhesive 50 may be cured by a light beam of the wavelength range except ultraviolet rays. In this case, the light irradiation device 110 is configured to emit light of this wavelength range.

In each embodiment, a manufacturing method for adjusting the viscosity of the adhesive 50 in accordance with the height of the piezoelectric elements 31 and 32 arranged on the actuator mounting portions 15 and 16 is exemplified. As another example, a pressure for arranging the piezoelectric elements 31 and 32 on the actuator mounting portions 15 and 16 of the subsequent work may be adjusted in accordance with the height of the piezoelectric elements 31 and 32. In this case, the pressure may be reduced when the height of the piezoelectric elements 31 and 32 is smaller than a lower limit of the permissible range, and the pressure may be increased when the height is larger than an upper limit of the permissible range.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a disk drive suspension, the disk drive suspension comprising a base plate, a load beam provided on the base plate, and an actuator mounting portion having a piezoelectric element mounted thereon, the piezoelectric element comprising a first electrode and a second electrode facing each other, and the method including:
  applying an adhesive to the actuator mounting portion;
  increasing a viscosity of the adhesive by emitting light to the adhesive applied to the actuator mounting portion;
  arranging the piezoelectric element on the adhesive having the increased viscosity so that the first electrode contacts with the adhesive;
  detecting a height, from one of the base plate and the load beam, of the second electrode of the piezoelectric element arranged on the actuator mounting portion; and
  correcting an irradiation condition of the light in accordance with the detected height of the piezoelectric element,
  wherein the correcting the irradiation condition includes raising at least one of an irradiation time, an illuminance, and a quantity of the light when the height of the piezoelectric element detected in the detecting is smaller than a first threshold value which is a lower limit of the height, and lowering at least one of the irradiation time, the illuminance, and the quantity of the light when the height of the piezoelectric element detected in the detecting is larger than a second threshold value which is a upper limit of the height.

2. The method of claim 1, further including:
  fixing the piezoelectric element to the actuator mounting portion by heating the actuator mounting portion on which the piezoelectric element is arranged and curing the adhesive.

3. The method of claim 1, wherein the height used to correct the irradiation condition is a height of a central part of the piezoelectric element.

4. The method of claim 1, wherein the height used to correct the irradiation condition is an average value of heights of a plurality of parts in the piezoelectric element.

5. The method of claim 1, wherein the height used to correct the irradiation condition is an average value of heights of the piezoelectric elements arranged on actuator mounting portions of a plurality of disk drive suspensions.

6. A manufacturing apparatus of a disk drive suspension comprising a base plate, a load beam provided on the base plate, and an actuator mounting portion having a piezoelectric element mounted thereon, the piezoelectric element comprising a first electrode and a second electrode facing each other, and the apparatus comprising:
  an adhesive supply device applying an adhesive to the actuator mounting portion;
  a light irradiation device increasing a viscosity of the adhesive by emitting light to the adhesive applied to the actuator mounting portion;
  an element supply device arranging the piezoelectric element on the adhesive having the increased viscosity so that the first electrode contacts with the adhesive;
  a height detector detecting a height, from one of the base plate and the load beam, of the second electrode of the piezoelectric element arranged on the actuator mounting portion; and
  a controller configured to correct an irradiation condition of the light of the light irradiation device in accordance with the height detected by the height detector,
  wherein the controller is configured to raise at least one of an irradiation time, an illuminance, and a quantity of the light from the light irradiation device when the height of the piezoelectric element detected by the height detector is smaller than a first threshold value which is a lower limit of the height, and to lower at least one of the irradiation time, the illuminance, and the quantity of the light from the light irradiation device when the height of the piezoelectric element detected by the height detector is larger than a second threshold value which is a upper limit of the height.

7. The manufacturing apparatus of claim 6, wherein the controller is configured to stop an operation of the manufacturing apparatus when a correction of lowering the at least one of the irradiation time, the illuminance, and the quantity of the light from the light irradiation device has been successively executed a first number of times, and is further configured to stop the operation of the manufacturing apparatus when a correction of raising the at least one of the irradiation time, the illuminance, and the quantity of the light from the light irradiation device has been successively executed a second number of times.

* * * * *